May 11, 1965 I. N. VORIE 3,182,671

ETCHING APPARATUS

Filed Dec. 19, 1962 3 Sheets-Sheet 1

INVENTOR.
INNOKENT N. VORIE

BY Sidney Magnes

AGENT

INVENTOR.
INNOKENT N. VORIE
BY Sidney Magnes
AGENT

May 11, 1965 I. N. VORIE 3,182,671

ETCHING APPARATUS

Filed Dec. 19, 1962 3 Sheets-Sheet 3

INVENTOR.
INNOKENT N. VORIE
BY Sidney Magnes
AGENT

United States Patent Office 3,182,671
Patented May 11, 1965

3,182,671
ETCHING APPARATUS
Innokent N. Vorie, Newport Beach, Calif., assignor to North American Aviation, Inc.
Filed Dec. 19, 1962, Ser. No. 245,784
1 Claim. (Cl. 134—148)

This invention relates to an improvement in etching; and more particularly to an improvement in the etching of "printed-wiring circuit boards."

*Background*

In the past, many electronic devices used insulated wires to interconnect various parts of the circuitry. These wires tended to be bulky, numerous, and subject to human error in their connections.

In order to overcome the above difficulties, a concept known as a "printed-wiring circuit board" was introduced. Broadly speaking, a printed-wiring circuit board comprises a base, or "substrate," of electrically insulative material, such as a non-conductive plastic. Onto this substrate is bonded a thin sheet of copper. Portions of the copper are then chemically etched away to leave narrow stripes of copper that conduct electricity from one point to another in the same manner as wires.

The resultant board has the appearance of copper stripes that had been printed onto the substrate, thus leading to the term "printed-wire circuit boards."

The resultant printed-wire circuit boards have a number of advantages; among which are precise reproducibility, decreased size and weight, and even more important, freedom from human error.

In an attempt to further miniaturize and lighten the overall electronic devices, it became desirable to reduce the size of these printed-wiring boards even further. This result is achieved by making the copper stripes even narrower, and spacing them closer together.

Since this narrowing of the conductive stripes, and placing them closer together was dependent upon the etching process that removed the copper from between the stripes, it soon became evident that the etching process was one of the factors that limited the miniaturization and lightening of the electronic devices.

The etching process usually used a chemical known as ferric chloride ($FeCl_3$). This ferric chloride etchant is extremely active, and will attack most materials; plastics and the noble metals being, in general, immune to this attack.

In general, the etching process is performed as follows. The copper sheet is coated with a material, known as a "photo resist," that changes its characteristics when exposed to light. A photograph of the desired printed-wire circuit is optically projected onto this light-sensitive material, which thereupon changes in such a way that certain portions can be removed, while other portions stick to the copper and act as a "resist" to the attack of the etchant. The unprotected areas of copper are etched away, thus leaving an electrically-conductive printed-wire pattern of copper stripes.

Other methods may be used to prepare printed-wire circuit boards; but the most satisfactory results are obtained by using an etching process to leave a pattern of copper stripes.

One of the problems associated with etching is the "undercutting" of the copper stripes. This result is caused by the etchant attacking the portion of the copper stripe adjacent the substrate, so that the cross section of the copper stripe tends to assume the shape of an inverted triangle or a parallelogram with the apex bonded to the substrate. The narrow apex degrades the strength of the bond, limits the amount of electricity the stripe can conduct, and—in extreme cases—becomes so narrow that the conductive copper stripe lifts off the substrate under conditions of increase in temperature, excessive electrical current, or the like. Moreover, undercutting tends to produce a copper stripe that has a wavy rather than a straight edge; the crest portions of the adjacent wavy edges frequently approaching so close to each other as to permit undesired electrical discharges between the wavy edges of adjacent copper stripes.

In the past, etching was generally performed by dipping the board to be etched into the etchant solution; and then withdrawing the board so that the etchant could be drained off or washed away.

This method worked well as long as the copper stripes were fairly wide; because even though the etchant tended to undercut the copper stripe, the stripe and the spacing between stripes was wide enough so that the undercutting could be tolerated.

In the desire to achieve narrower and closer-spaced stripes, however, the undercutting became quite a problem, because of the resultant narrowing of the stripes, and the reduced adhesion to the substrate.

*Synopsis*

Broadly stated, my invention contemplates the concept of causing extremely-small droplets of etchant to impinge with a high-velocity upon the board to be etched. One embodiment uses a rotating paddle wheel to cause the etchant to take the form of a fog; and a high-velocity stream of gas then accelerates the drops of etchant so that they are broken-up into extremely-small mist droplets. A second embodiment forms extremely-small, high-velocity droplets immediately.

*Objects and Drawings*

It is therefore the principal object of my invention to provide an improvement in etching.

The attainment of this object and others will be realized from the following specification, taken in conjunction with the drawings, of which FIGURE 1 shows the basic concept of my invention;

*Description of the invention*

Figure 1:
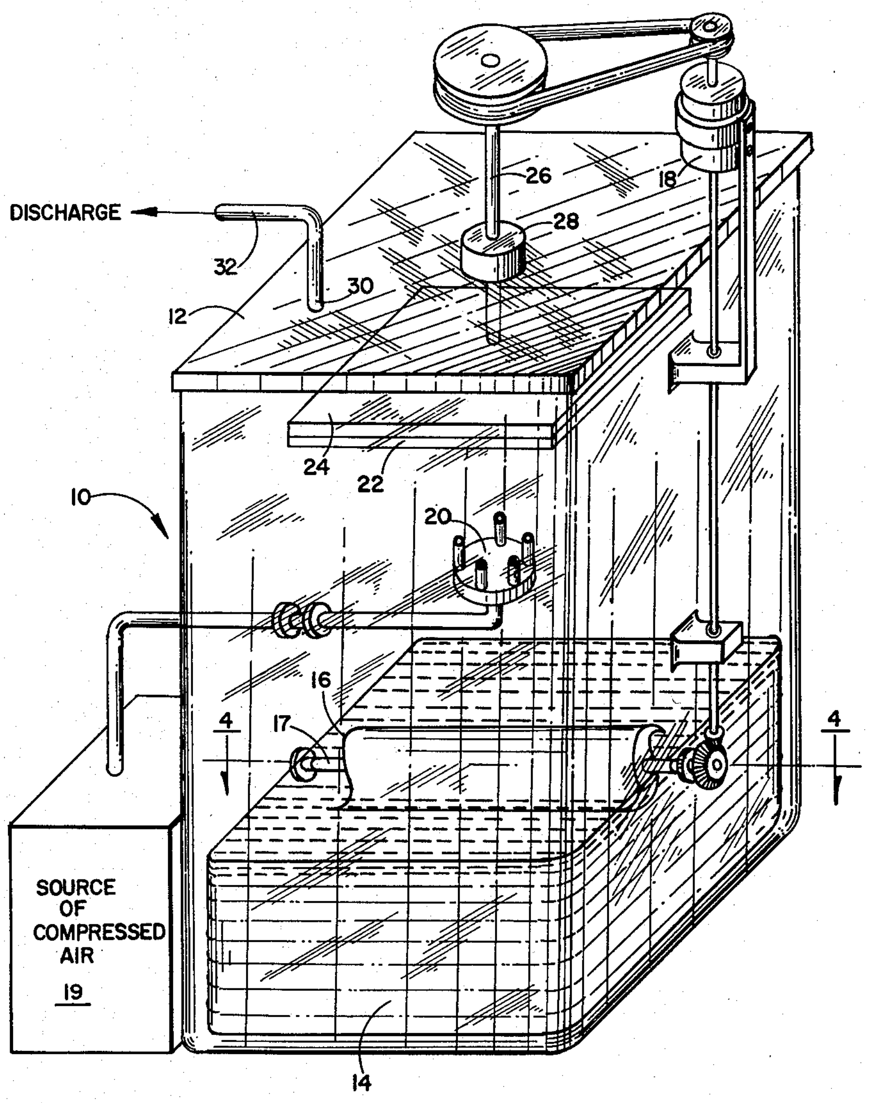

The basic concept of my invention may be readily understood from FIGURE 1.

This illustration shows a container 10 having a lid 12; these preferably being of a plastic, such as Lucite, that is immune to the etchant. Container 10 contains a quantity of liquid etchant 14; and a rotatable paddle wheel 16 is positioned so that its edge barely breaks the surface of etchant 14. Paddle wheel 16 preferably has an S-shaped cross section, for reasons to be discussed later, and its shaft 17 is rotated at a suitably high speed by a motor 18 and suitable gearing—which is preferably positioned outside of container 10 to be protected from the etchant 14.

As the paddle wheel 16 rotates, it produces a fog of etchant; the size of the fog particles depending to a great extent upon the speed of rotation of paddle wheel 16, and upon the distance that the edge of paddle wheel 16 dips below the surface of the etchant 14.

Figure 2:
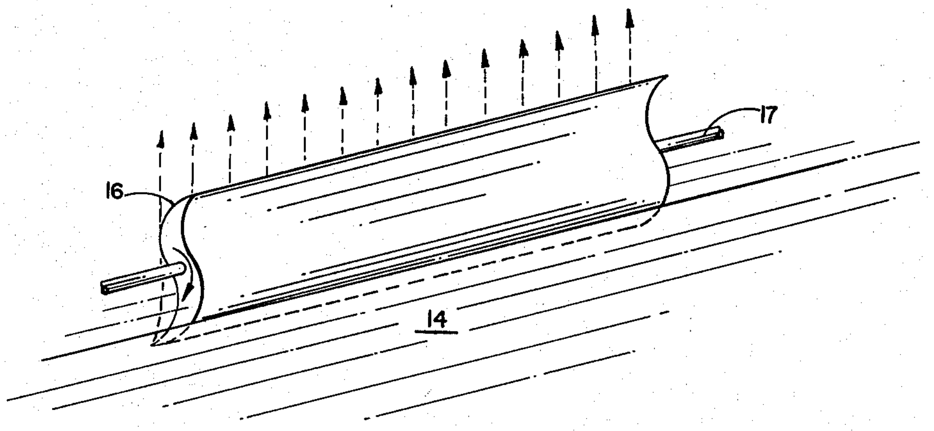
FIGURE 2 shows a fragmentary enlarged view of the paddle wheel.

As shown in FIGURE 2, paddle wheel 16 has an S-shaped cross section; and is rotated in a direction such that its tip scoops-up the etchant and flings it upwards as shown by the dotted arrows.

If the paddle wheel rotates too fast, the etchant is thrown off the edges by centrifugal force; whereas if the paddle wheel rotates too slowly, it does not scoop up the etchant. When the paddle wheel speed and depth of penetration are correct, a cloud of the resultant fog can actually be seen just above the paddle wheel. The size and density of the cloud can be readily controlled by varying the rotational speed of the paddle wheel 16, and by controlling the level of the etchant 14.

In order to break the drop of fog into an even smaller size, and to direct the resultant droplets forcibly at the board to be etched, I use air from a pressurized source 19 shown in FIGURE 1; and cause the air to be emitted at a very high-velocity from a nozzle-arrangement such as 20.

The nozzle-arrangement shown produces a satisfactorily uniform spray pattern; but other nozzle-arrangements may be used to produce other spray patterns.

I have found that the higher the air-velocity at nozzle-arrangement 20, the better the etching process; this higher air-velocity being achievable either by increasing the air pressure, or by decreasing the size of the opening of the jets comprising the nozzle-arrangement.

The board 22 to be etched is positioned above nozzle-arrangement 20; preferably substantially horizontal, so that the etchant does not become trapped between the board's substrate and the edge of the copper stripes. Since the board is preferably perpendicular to the path taken by the air and droplets of etchant, the trajectory of the air and droplets becomes substantially vertical. Since the spray pattern is not always uniform, I have found that more consistent etching results may be obtained by attaching board 22 to a plate 24 whose shaft 26 may be rotated manually or by any suitable means. A bushing 28 positions the plate 24 at a desirable height. Thus, all portions of the rotating board 22 are exposed to the etchant spray in an equal manner.

It will be seen from FIGURE 1 that new air is constantly being introduced into container 10. A vent hole 30 is provided to relieve the air pressure, and—if desired—the mixture of air and etchant that is emitted through vent hole 30 may be conducted by means of a pipe or tubing 32 to a disposal area, such as a sink.

While there are conflicting theories as to why this process produces improved results, the explanation that I prefer is as follows, and may be understood from FIGURE 3.

This drawing shows a cross section of the board 22 to be etched, which is illustrated as comprising a plastic substrate 34, a sheet of copper 36 bonded to the substrate, and a light-sensitive protective material 38. A small area of the protective material 38 has been removed, so that the etchant may attack and remove the copper 36 at the unprotected portion.

Figure 3:
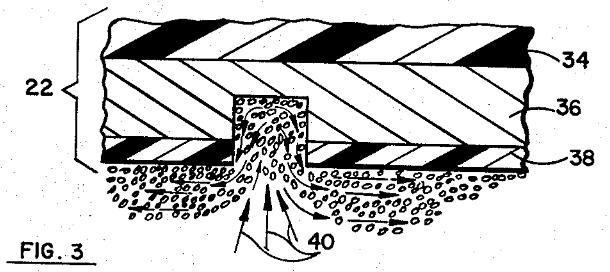
FIGURE 3 shows the etching process.

In FIGURE 3 it is assumed that the etching action is in progress, and has already etched away a portion of the copper 36.

Droplets of new etchant approach this area in the direction of arrows 40, the droplets of etchant being driven upwards by the force of the air emerging from nozzle-arrangement 20.

Several things should be noted. First of all, a large number of minute droplets of etchant are operating simultaneously on the exposed portions of the copper, so that a fast etching rate and relatively square corners are obtainable. Secondly, the small droplets of etchant have a relatively low adhesion to the sides of the copper, and are therefore more easily removed than larger drops of etchant. Thirdly, the incoming etchant droplets—since they are impinging at a high velocity—are forcibly driven into the hole that is being etched; and with the assistance of gravity tend to set up a circulation that drives the used etchant out of the etched hole. This etchant-droplet movement has the triple benefits of (1) removing the exhausted etchant, (2) replacing it with fresh etchant at exactly the same rate, and (3) preventing the etchant from clinging to the sides of the hole—thus preventing undercutting.

In comparative tests, my invention has produced narrower and closer-spaced stripes than prior-art devices; and has reduced the etching time, for comparable results, to about one-fifth of that previously required.

Since the etchant attacks most materials, a novel bearing is necessary for shaft 17, since the usual ceramic bearings, stainless-steel bearings, graphite bushing, etc., could not withstand the destructive action of the etchant.

Figure 4:
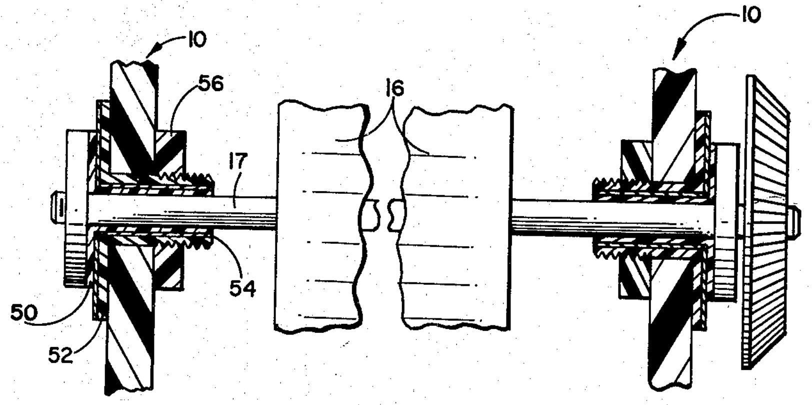
FIGURE 4 shows an etchant-resistant bearing.

FIGURE 4 illustrates a bearing that provides completely satisfactory operation. It comprises an inner sleeve 50 of slippery material, such as Teflon, that is affixed to, and rotates with shaft 17. An outer Teflon sleeve 52 is affixed to the wall of the container 10; and a thin tantalum sleeve 54 separates the two Teflon sleeves. Suitable flanges, and nuts 56 tighten the assembly, and prevent leakage of the etchant.

The disclosed bearing operates in a completely satisfactory manner, with shaft speeds as high as 5,000 r.p.m.

The exposed portions of shaft 17 are coated with an etchant-resistant epoxy or other material; as is paddle wheel 16, if it does not consist of an etchant-immune material.

Figure 5:
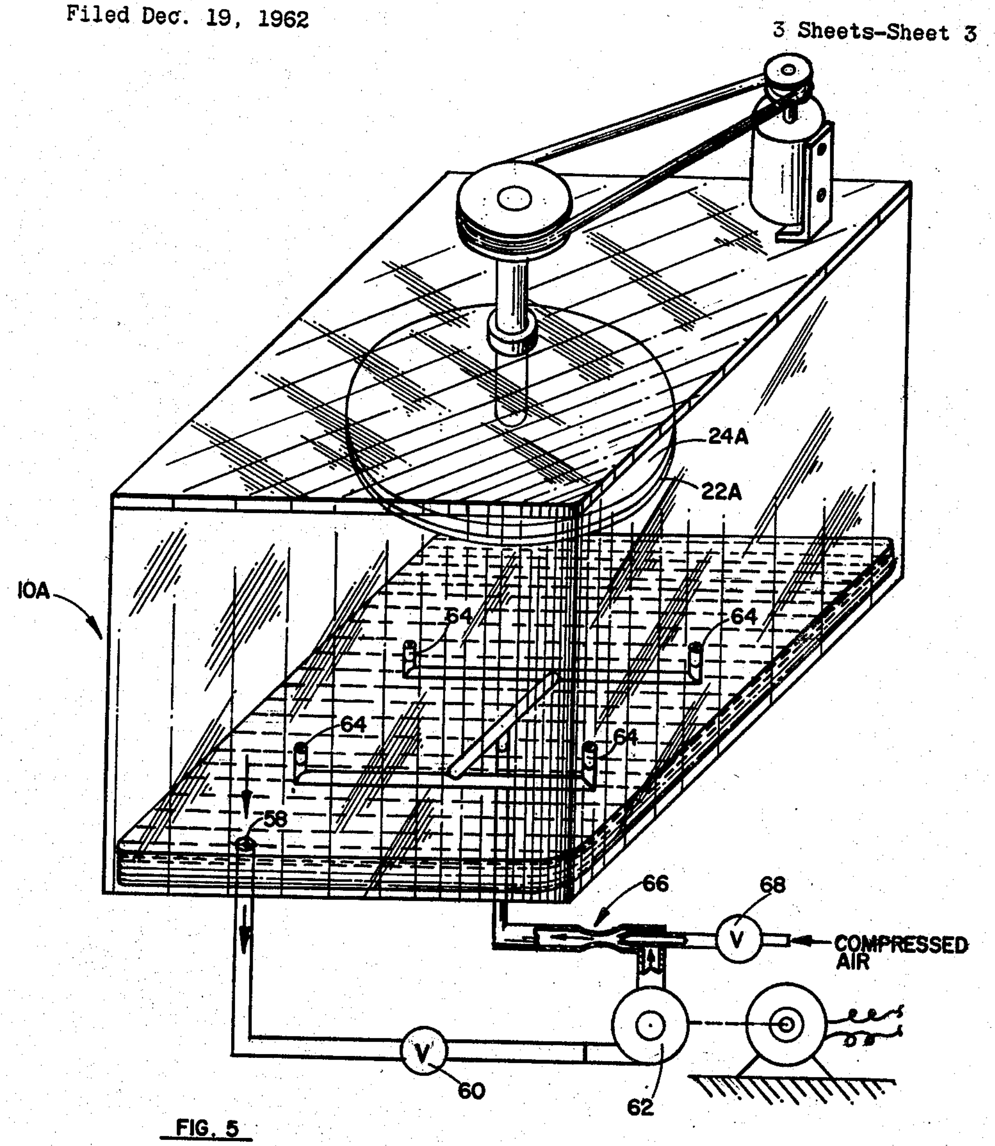
FIGURE 5 shows another embodiment of my invention.

FIGURE 5 shows another embodiment of my invention.

This arrangement, instead of using a paddle wheel to produce a fog, produces an etchant-mist directly. A liquid-intake 58, positioned below the surface of a pool of etchant, directs the etchant through suitable piping and a control valve 60 to a pump 62. The etchant is then pumped back to jets 64 positioned in the container 10A above the surface of the pool of etchant. The flow of etchant activates a venturi nozzle 66 that provides air from a pressurized source, through a suitable air-control valve 68.

In this way, a high-velocity mist of air and droplets of etchant is directed toward a board 22A to be etched, the board being mounted on a rotatable plate 24A, to achieve the same results as achieved by the structure of FIGURE 1.

Although the invention has been described and illustrated in detail, it is to be clearly understood that the same is by way of illustration and example only and is not to be taken by way of limitation, the spirit and scope of this invention being limited only by the terms of the appended claim.

I claim:

In combination:

a container having an upper and lower portion, and having an etchant in said lower portion;

means for holding an element whose surface is to be etched substantially horizontal and facing downward in the upper portion of said container;

means for rotating said element to be etched; and means for producing a fog of etchant in said container from said etchant;

vertically-directed nozzle means directing a gas upward through said fog towards said element for breaking said fog into smaller particles, and for accelerating said particles in a vertical direction toward said surface to be etched whereby said particles are carried by gravity away from said surface to be etched in a direction perpendicular thereto.

(References on following page)

References Cited by the Examiner

UNITED STATES PATENTS

| | | | |
|---|---|---|---|
| 995,148 | 6/11 | Johnston | 134—102 |
| 1,001,031 | 8/11 | Hilliard | 134—147 |
| 1,434,887 | 11/22 | Gruner | 134—148 |
| 1,562,642 | 11/25 | Holstrom. | |
| 1,795,069 | 3/31 | Baker | 308—36.1 |
| 1,839,264 | 1/32 | Replogle | 308—36.1 |
| 1,959,921 | 5/34 | Lewis | 134—148 |
| 2,651,869 | 9/53 | Guenst | 134—102 |
| 2,700,838 | 2/55 | Guenst | 134—147 |

FOREIGN PATENTS

| | | |
|---|---|---|
| 1,066,993 | 1/54 | France. |
| 18,540 | 1908 | Great Britain. |

CHARLES A. WILLMUTH, *Primary Examiner.*